United States Patent
Whittet et al.

(10) Patent No.: US 7,760,031 B2
(45) Date of Patent: Jul. 20, 2010

(54) METHOD FOR REDUCING INTER MODULATION DISTORTION PRODUCTS OF A COMBINED CARRIER WAVE USING PHASE ALIGNMENT OF THE CARRIER COMPONENTS

(75) Inventors: Gregory Clayton Whittet, Saskatoon (CA); Surinder Kumar, Victoria (CA)

(73) Assignee: Vecima Networks Inc., Victoria, British Columbia (CA)

( * ) Notice: Subject to any disclaimer, the term of this patent is extended or adjusted under 35 U.S.C. 154(b) by 375 days.

(21) Appl. No.: 12/044,371

(22) Filed: Mar. 7, 2008

(65) Prior Publication Data

US 2008/0224784 A1   Sep. 18, 2008

Related U.S. Application Data

(60) Provisional application No. 60/894,238, filed on Mar. 12, 2007.

(51) Int. Cl.
*G06F 1/02* (2006.01)
(52) U.S. Cl. ............................. 331/56; 331/48; 331/182; 327/106; 708/271

(58) Field of Classification Search .................. 331/46, 331/47, 48, 50, 55, 56, 74, 1 A, 2, 172, 175, 331/182, 187; 327/105, 106, 107; 708/200, 708/271, 272, 273
See application file for complete search history.

(56) References Cited

U.S. PATENT DOCUMENTS

| | | | | |
|---|---|---|---|---|
| 4,992,743 | A * | 2/1991 | Sheffer | 327/106 |
| 6,320,431 | B1 * | 11/2001 | Potson et al. | 327/106 |
| 7,506,014 | B2 * | 3/2009 | Drummond | 708/271 |

* cited by examiner

*Primary Examiner*—Robert Pascal
*Assistant Examiner*—Ryan Johnson
(74) *Attorney, Agent, or Firm*—Adrian D. Battison; Ade & Company Inc.

(57) ABSTRACT

A method is provided for reducing inter modulation distortion products using multi-carrier phase alignment of the type where a combined carrier signal is generated from the combined output carried waves of a plurality of numerically controlled oscillators in which the frequency of the carrier wave can be altered by changing an input value into the oscillator. In particular the initial phase of the output carrier waves is adjusted so that the peak amplitude of the combined carrier signal is minimized so that compression of the higher amplitude portions of the combined signal is reduced.

13 Claims, 4 Drawing Sheets

METHOD FOR REDUCING INTER MODULATION DISTORTION PRODUCTS OF A COMBINED CARRIER WAVE USING PHASE ALIGNMENT OF THE CARRIER COMPONENTS

This application claims the benefit under 35 U.S.C. 119 of Provisional Application No. 60/894,238 filed Mar. 12, 2007.

This invention relates to a method for generating a combined carrier signal from the combined output carried waves of a plurality of numerically controlled oscillators where the frequency of which carrier wave can be altered by changing an input value into the oscillator and particularly to a method for reducing inter modulation distortion products using multi-carrier phase alignment.

BACKGROUND OF THE INVENTION

Methods for generating a combined carrier signal from the combined output carrier waves of a plurality of numerically controlled oscillators where the frequency of each carrier wave can be altered by changing an input value into the oscillator are well known and the numerically controlled oscillators for use in such methods are also well known.

One problem which arises is that of the generation of distortion of the carrier wave during transmission and particularly the generation of inter-modulation distortion products.

SUMMARY OF THE INVENTION

It is one object of the invention to provide an improved method of this general type.

According to one aspect of the invention there is provided a method for generating a combined carrier signal comprising:

providing a plurality of numerically controlled oscillators;

each oscillator generating a respective output carrier wave the frequency of which carrier wave can be altered by changing an input value into the oscillator;

combining the carrier waves to form the combined carrier signal;

and adjusting an initial phase of the output carrier waves so that a peak amplitude of the combined carrier signal is reduced.

Preferably the initial phase of the output carrier waves is adjusted so that the peak amplitude of the combined carrier signal is minimized.

Preferably the method includes reducing Inter-Modulation Distortion products of the combined carrier signal by reducing the peak amplitude such that compression of the higher amplitude portions of the combined signal is reduced.

Preferably the method includes calculating the initial phase offset for each oscillator to achieve an optimum phase relationship with the other carrier waves.

Preferably the method includes repeatedly re-aligning and resetting the initial phase of the output carrier waves so that a peak amplitude of the combined carrier signal is maintained reduced.

Preferably there is provided a phase alignment circuitry which repeatedly triggers re-alignment of the initial phase offset.

Preferably each oscillator receives an alignment pulse from the phase alignment circuitry and an initial offset input.

Preferably the phase alignment circuitry includes a phase alignment counter.

Preferably the method includes rectifying any misalignment of the carrier waves due to hardware or software glitches by the phase alignment circuitry.

Preferably each oscillator includes a phase accumulator where the phase accumulators may be of different sizes and wherein the size of the phase alignment counter is set to at least the same size as the largest phase accumulator.

Preferably the initial phase is different for each oscillator. However the initial phase can be the same for each oscillator.

Preferably each oscillator is arranged such that the carrier wave thereof is altered by changing a respective phase increment value of the oscillator where the higher the phase increment value the higher the frequency of the respective carrier wave.

BRIEF DESCRIPTION OF THE DRAWINGS

One embodiment of the invention will now be described in conjunction with the accompanying drawings in which.

DETAILED DESCRIPTION

Figure 1:
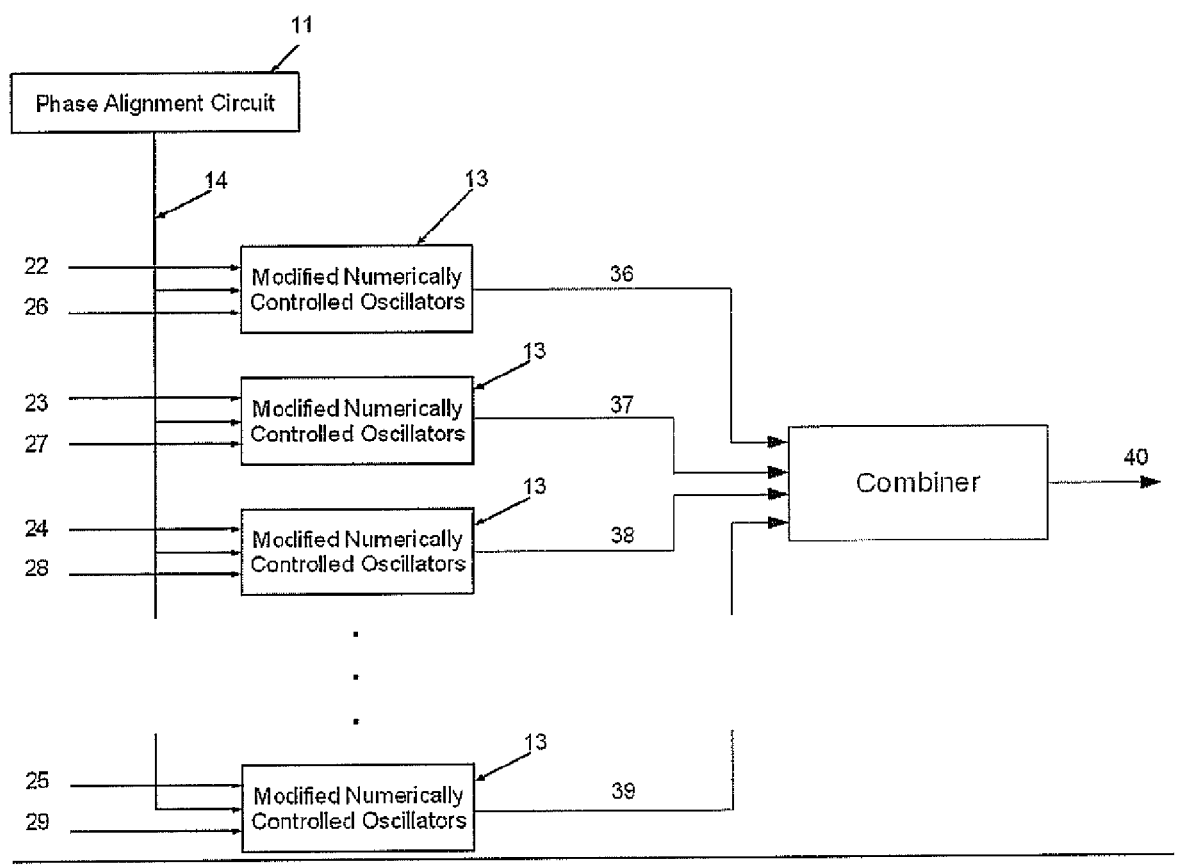
FIG. 1 is a schematic overview diagram of a method according to the present invention for generating a combined carrier signal using a series of numerically controlled oscillators.

FIG. 1 outlines one embodiment of the method and apparatus for reducing Inter Modulation Distortion Products using multi-carrier phase alignment. The design is made up of multiple modified numerically controlled oscillator (NCO) circuits 13 that allow the initial phase of the carrier waves 36, 37, 38, 39 to be adjusted so that the peak amplitude of the combined output 40 of these carrier waves 36, 37, 38, 39 is minimized.

This design also includes phase alignment circuitry 11 which ensures that the initial phase offset will be continually re-aligned to ensure that any unexpected hardware or software glitches that may occur do not misalign the phase offsets of the output carrier waves 36, 37, 38, 39.

This design can be scaled to encompass any number of carrier waves 36, 37, 38, 39 by adding more modified NCO circuits 13.

Figure 2:
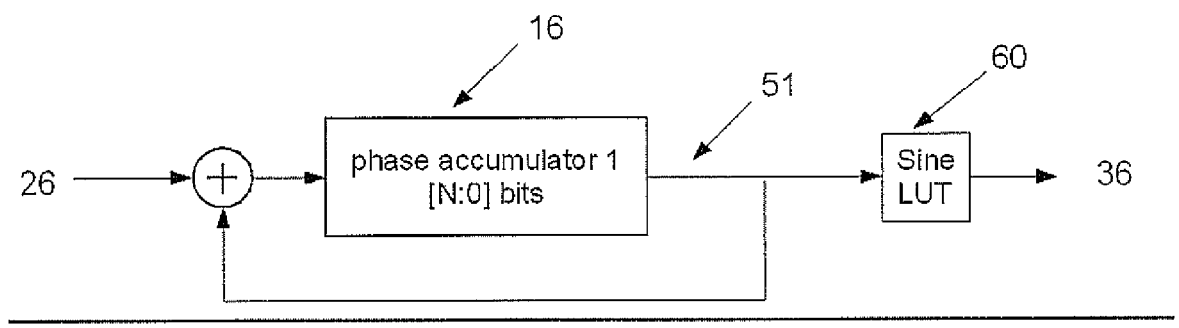
FIG. 2 is a schematic diagram of a conventional numerically controlled oscillator.

FIG. 2 shows a detailed design of a conventional NCO circuit. This includes an input 26 for the phase increment value which is fed to the phase accumulator 16. The output of the phase accumulator 51 is added to the phase increment value 26 and then placed in the phase accumulator 16.

The output of the phase accumulator 51 is also fed into a Sine look up table (LUT) 60 where a list of values is stored that represent one full cycle of a sampled sine wave. Each possible output value from the phase accumulator 51 has an associated value in the Sine LUT 60 and is output when the Sine LUT 60 receives that particular value.

Figure 3:
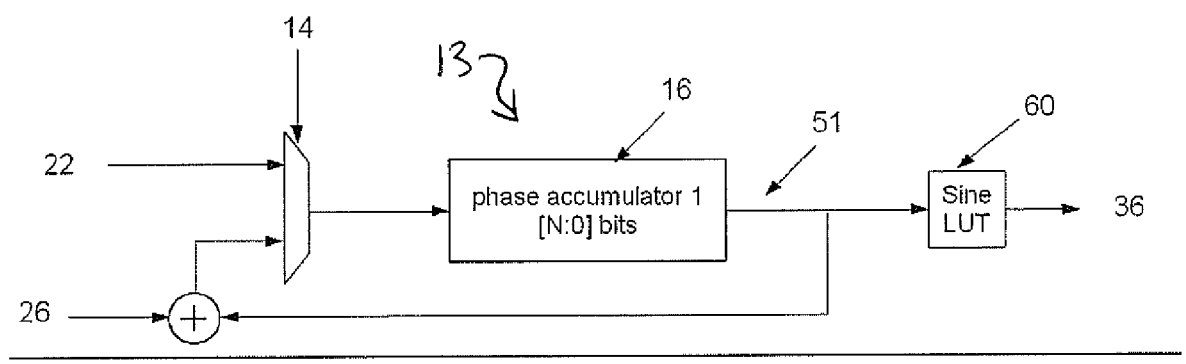
FIG. 3 is a schematic illustration of each modified numerically controlled oscillator of FIG. 1.

FIG. 3 shows a more detailed design of the modified NCO 13. The conventional NCO circuit of FIG. 2 has been modified by introducing an input for an alignment pulse 14 and an initial offset input 22. When the alignment pulse 14 is present the phase accumulator 16 is loaded with the value of the initial offset at input 22. When the alignment pulse 14 is not present the output of the phase accumulator 51 is added to the phase increment value 26 and then placed in the phase accumulator 16. The output of the phase accumulator 51 is then fed into the Sine LUT 60.

Figure 4:
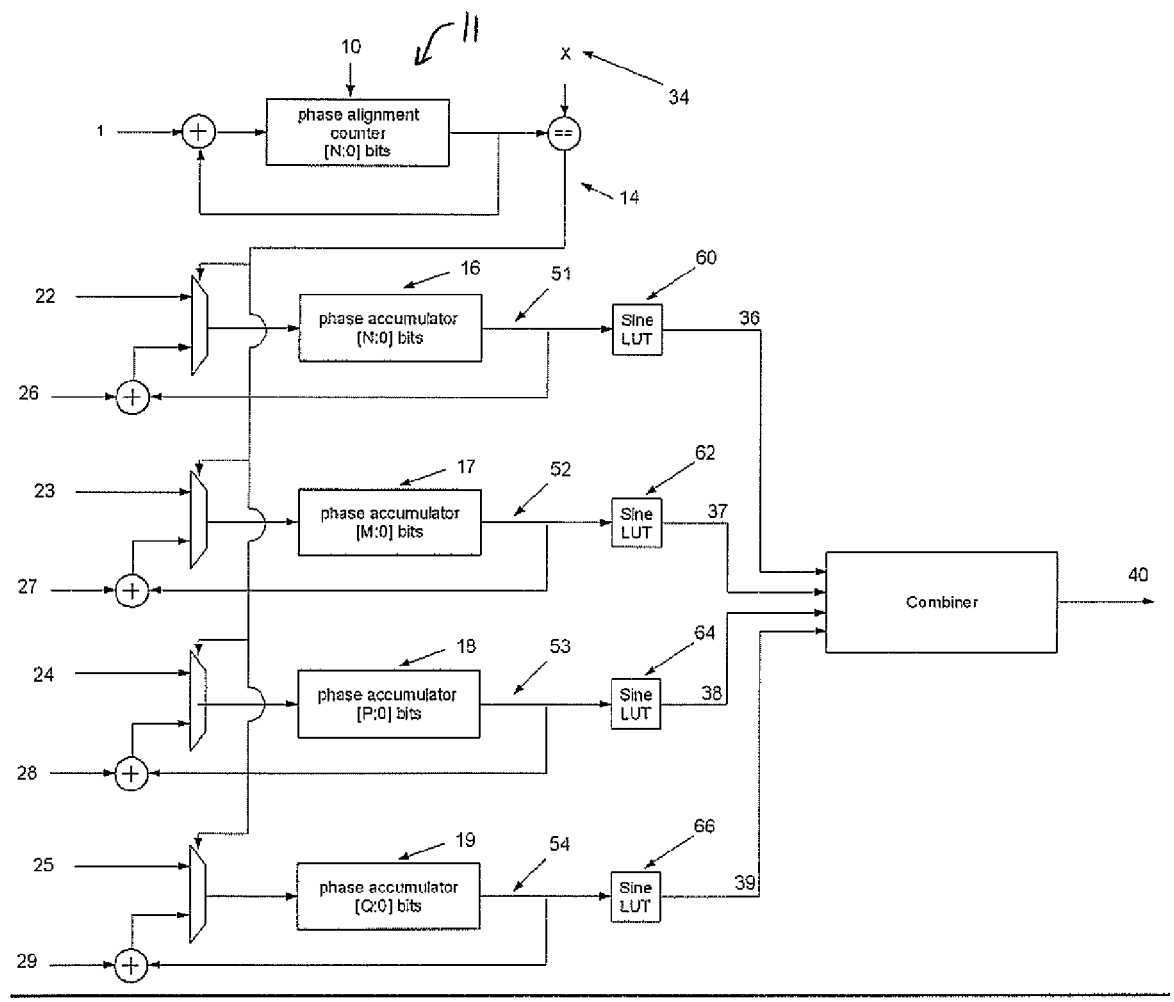
FIG. 4 is a more detailed diagram of the method of FIG. 1 for a system utilizing four carrier waves.

FIG. 4 shows a diagram of the method and apparatus for a system for four carrier waves and using the modified NCO of FIG. 3. The frequency of each carrier wave 36, 37, 38 and 39 output from the respective Sine LUT 60, 62, 64 and 66 and the respective phase accumulator 16, 17, 18 and 19 can be altered by changing its respective phase increment value 26, 27, 28 and 29. As stated previously, the higher the phase increment value 26, 27, 28 and 29 the higher is the frequency of the respective carrier wave 36, 37, 38 and 39.

To optimize the reduction in Inter-Modulation Distortion products the appropriate initial phase offset 22, 23, 24 and 25 will have to be calculated for each modified NCO 13 in the system to achieve the optimum phase relationships with the other carrier waves 36, 37, 38 and 39. The initial phase offset 22, 23, 24 and 25 will vary depending on how many NCOs 13 are used in the implementation of the design and which Inter-Modulation Distortion products are most important to reduce. These calculations to determine these characteristics are well within the skill of a person skilled in this art.

The input X 34 is used to trigger the phase alignment signal 14 for each of the circuits 13. A phase alignment counter 10 has its size set to the same size as the largest phase accumulator 16, 17, 18 and 19 in the system. When the phase alignment signal 14 is sent to the modified NCOs 13, the phase offset 22, 23, 24 and 25 will be loaded into the phase accumulator 16, 17, 18, 19. When the phase alignment signal is not sent to the modified NCO 13, the output 51, 52, 53 and 54 of the phase accumulators 16, 17, 18 and 19 will be added to the corresponding phase increment value 26, 27, 28 and 29 and that value will be loaded into the phase accumulator 16, 17, 18 and 19.

Thus the peak amplitude of the composite signal can be minimized through intelligent selection of their initial phase values. This is beneficial for reducing the Inter-Modulation Distortion products which are caused, at least in part, by subsequent compression of the higher amplitude portions of the composite signal. The initial phase of one carrier relative to the other can be set through the system described below.

The phase alignment counter 10 with bit width set to the bit width of the largest phase accumulator 16, 17, 18 and 19 in the system is incremented by 1 every cycle that this largest phase accumulator 16, 17, 18 and 19 is incremented. Each phase accumulator 16, 17, 18 and 19 in the system can be an equal number of bits wide or a different number of bits wide. In FIG. 4 for the phase accumulators 16, 17, 18 and 19 N>M>P>Q, therefore the phase alignment counter 10 has a bit width of N.

Depending upon the exact phase increment value 26, 27, 28 and 29 being used for each carrier a phase alignment counter 10 with fewer bits may work, but using a counter with the full width as described above will work with any phase increment value 26, 27, 28, 29.

The input X 34 is used to trigger when the phase alignment signal 14 is sent. When the phase alignment counter 10 equals X, the phase alignment signal in sent to the modified NCOs 13. X can be any integer between 0 and $([2^{(N+1)}]-1)$ where N+1 is the number of bits of the phase alignment counter 10. The alignment signal 14 is sent once for every full cycle the phase alignment counter 10 completes.

When each modified NCO circuit 13 receives the alignment pulse 14 from the phase alignment counter 10 the phase accumulator 16, 17, 18 and 19 sets its value to that of the initial phase 22, 23, 24 and 25 which may or may not be different for each carrier 36, 37, 38 and 39 in the system. The initial phase offset for each oscillator is calculated to achieve an optimum phase relationship with the other carrier waves and so that the peak amplitude of the combined carrier signal is minimized. The calculations necessary to achieve these will be well apparent to a person skilled in this art.

Once the phase of the carriers 36, 37, 38 and 39 have been aligned using the initial phase value 22, 23, 24 and 25, another alignment pulse 14 does not need to be sent due to the nature of the phase increment 26, 27, 28 and 29 of each carrier.

While the phase offset of the carrier waves 36, 37, 38 and 39 only needs to be aligned once, sending the alignment pulse 14 at regular intervals will ensure that any misalignment of the carrier waves 36, 37, 38 and 39 due to hardware or software glitches is automatically rectified. In the event that a hardware glitch occurs and the phase offset of the carrier waves 36, 37, 38 and 39 becomes misaligned the phase alignment circuitry 11 will re-align the carrier waves 36, 37, 38 and 39 to the proper offsets because it continually sends out phase alignment pulses 14.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. A method for generating a combined carrier signal comprising:
    providing a plurality of numerically controlled oscillators;
    each oscillator generating a respective output carrier wave the frequency of which carrier wave can be altered by changing an input value into the oscillator;
    combining the carrier waves to form the combined carrier signal;
    and adjusting an initial phase of the output carrier waves so that a peak amplitude of the combined carrier signal is reduced.

2. The method according to claim 1 wherein the initial phase of the output carrier waves is adjusted so that the peak amplitude of the combined carrier signal is minimized.

3. The method according to claim 1 including reducing Inter-Modulation Distortion products of the combined carrier signal by reducing the peak amplitude such that subsequent compression of the higher amplitude portions of the combined signal is reduced.

4. The method according to claim 1 including calculating the initial phase offset for each oscillator to achieve an optimum phase relationship with the other carrier waves.

5. The method according to claim 1 including repeatedly re-aligning and resetting the initial phase of the output carrier waves so that a peak amplitude of the combined carrier signal is maintained reduced.

6. The method according to claim 5 wherein there is provided a phase alignment circuitry which repeatedly triggers re-alignment of the initial phase offset.

7. The method according to claim 6 wherein each oscillator receives an alignment pulse from the phase alignment circuitry and an initial offset input.

8. The method according to claim 6 including rectifying any misalignment of the carrier waves due to hardware or software glitches by the phase alignment circuitry.

9. The method according to claim 6 wherein the phase alignment circuitry includes a phase alignment counter.

10. The method according to claim 9 wherein each oscillator includes a phase accumulator where the phase accumulators may be of different sizes and wherein the size of the phase alignment counter is set to at least the same size as the largest phase accumulator.

11. The method according to claim 1 wherein the initial phase is different for each oscillator.

12. The method according to claim 1 wherein the initial phase is the same for each oscillator.

13. The method according to claim 1 wherein each oscillator is arranged such that the carrier wave thereof is altered by changing a respective phase increment value of the oscillator where the higher the phase increment value the higher the frequency of the respective carrier wave.

* * * * *